United States Patent [19]
Boerner et al.

[11] Patent Number: 6,051,925
[45] Date of Patent: Apr. 18, 2000

[54] DIODE-ADDRESSED COLOR DISPLAY WITH MOLECULAR PHOSPHOR

[75] Inventors: Herbert Boerner; Thomas Jüstel; Hans Nikol; Cornelis Ronda, all of Aachen, Germany

[73] Assignee: U.S. Philips Corporation, New York, N.Y.

[21] Appl. No.: 09/185,004

[22] Filed: Nov. 3, 1998

Related U.S. Application Data

[63] Continuation of application No. PCT/IB98/00259, Mar. 2, 1998.

[30] Foreign Application Priority Data

Mar. 3, 1997 [DE] Germany .......................... 197 08 407
Jan. 21, 1998 [DE] Germany .......................... 198 02 046

[51] Int. Cl.$^7$ ........................................................ H01J 63/04
[52] U.S. Cl. .......................... 313/503; 313/501; 313/502
[58] Field of Search ..................................... 313/486, 501, 313/502, 503; 252/301.4 R, 301.6 P

[56] References Cited

FOREIGN PATENT DOCUMENTS

WO9839806  9/1998  WIPO .......................... H01L 33/00

*Primary Examiner*—Vip Patel
*Attorney, Agent, or Firm*—John C. Fox

[57] ABSTRACT

A diode-addressed color display comprising an UV-diode and a phosphor of the general formula [Eu(diketonate)$_a$X$_{b1}$X'$_{b2}$], wherein X=pyridine or a unidentate pyridine derivative and X'=2,2'-bipyridine or a 2,2'-bipyridyl derivative and $2a+b_1+2b_2 =8$, is characterized by a high quantum efficiency and a high extinction coefficient in the near-UV wavelength range and enables a color-sensitive image reproduction to be achieved.

4 Claims, No Drawings

DIODE-ADDRESSED COLOR DISPLAY WITH MOLECULAR PHOSPHOR

This application is a continuation of PCT/IB98/00259 filed on Mar. 2, 1998.

BACKGROUND OF THE INVENTION

DESCRIPTION

The invention relates to a diode-addressed color display comprising an UV-diode and a phosphor for luminous representations, luminaries, solid state image intensifiers, display screens and monitors, and the like.

Color displays for luminous representations, luminaries, solid state image intensifiers, display screens and monitors should reproduce colored images in a color-sensitive manner. To achieve this, all color information about a colored image is represented by information about the three primary colors red, green and blue. By additive color mixing, any color, including white can be made from said three primary colors. This principle is employed by conventional color television receivers comprising a Braun tube as well as by the various flat-tube technologies, such as plasma display screen, electroluminescent display screen and LCD-displays. In other commercially available color displays, the color triad red, green and blue is generated by diode arrays comprising red, green and blue-emitting semiconductor diodes. In these color displays, however, the color-sensitive image reproduction, particularly the color-pure reproduction of green and blue is problematic. By virtue of the development of UV-emitting semiconductor diodes, the possibilities of a color-sensitive image reproduction for diode-addressed color displays has been increased, because, theoretically, any desired color of the visible light spectrum can be generated from UV-light. For this purpose, use is made of phosphors which absorb UV-light and reradiate it with a wavelength in the visible region. It is known that for this conversion of the UV-light into the visible region, use is made of inorganic pigments as phosphors. For example, it is known from Jpn. J. Appl. Phys. Vol. 35 (1996) pp. L838–839 to use ZnS:Ag, ZnS:Cu,Al and ZnCdS:Ag as the phosphors for converting the UV-light from UV-diodes in a fluorescent color display. These and other customary phosphors, such as $Y_2O_3$:Eu have a high quantum yield, but their absorption in the near-UV region, in which the UV-diodes emit, is very small.

Therefore, it is an object of the invention to provide a diode-addressed color display comprising an UV-diode and a phosphor, which phosphor has a high quantum efficiency and a high extinction coefficient in the near-UV wavelength range and enables a color-sensitive image reproduction to be achieved.

In accordance with the invention, this object is achieved by a diode-addressed color display comprising an UV-diode and a phosphor of the general formula [Eu(diketonate)$_a$X$_{b1}$X'$_{b2}$], wherein X=pyridine or a unidentate pyridine derivative and X' =2,2'-bipyridine or a 2,2'-bipyridine derivative, and $2a+b_1+2b_2=8$. Such a color display is distinguished by a high intrinsic emission quantum efficiency and a ligand-centered absorption in the range between 350 and 400 nm with a high extinction coefficient. After photophysical considerations, these two phosphor properties are in fact mutually exclusive. Surprisingly, it has been found, however, that phosphors of the general formula [Eu(diketonate)$_a$X$_{b1}$X'$_{b2}$] meet both criteria. The absorbing capacity of the inventive phosphors comprising the "antenna molecules" X, X' is a multiple of that of classic phosphors. A variation of the ligands X and X' enables the substantially linear, independent introduction of high absorptions at different wavelengths in the europium compounds. Concentration quenching, which is a general problem with classic phosphors having a high activator concentration, is not observed in the phosphors in accordance with the invention. The phosphors in accordance with the invention are molecular compounds and hence, in general, readily soluble in polar organic solvents. As a result, their properties can be readily examined in solution and the results can be transferred to the solid state. The solubility in organic solvents additionally enables new design concepts for diode-addressed color displays to be developed.

Within the scope of the invention, it is preferred that a=3. It may alternatively be preferred that a=2. These europium complexes are charged and can be bound to a polymer carrier, such as Nafion®. As a result, these phosphors are very stable and the photophysical properties further improved.

It is further preferred that the diode-addressed color display comprises a transparent polymeric coating which contains the phosphor of the general formula [Eu(diketonate)$_a$X$_{b1}$X'$_{b2}$] in solid solution. The coating is transparent because the light is not, scattered at the dissolved phosphor particles.

DESCRIPTION OF THE PREFERRED EMBODIMENTS

These and other aspects of the invention will be apparent from and elucidated with reference to three embodiments described hereinafter.

A diode-addressed color display in accordance with the invention comprises an UV-emitting diode as the excitation source for UV-radiation and a phosphor of the general formula [Eu(diketonate)$_a$X$_{b1}$X'$_{b2}$], wherein X is pyridine or a unidentate pyridine derivative and X' is 2,2'-bipyridine or a 2,2'-bipyridyl derivative, such as 1,10-phenanthrene and the derivatives thereof, and $2a+b_1+2b_2=8$. This phosphor converts the UV-radiation into visible red light.

The simplest color display is composed of the UV-diode and a transparent coating which is provided thereon and which comprises the phosphor. The transparent coating may, for example, comprise the phosphor in a solid solution in a transparent matrix of polyacrylate, epoxy resin or another polymer.

Since LEDs are mass-products, they are customarily embedded in epoxy housings, the molded-on lens of epoxy resin serving to improve the decoupling of light from the diode. In this embodiment, the phosphor can be provided as a contact layer between the actual diode and the epoxy-resin dome. The phosphor may alternatively be provided as a coating on the exterior of the epoxy-resin dome. In accordance with another embodiment, the phosphor is admixed with the epoxy resin and forms a solid solution therewith.

Large, two-dimensional displays can be readily manufactured in that a diode array is combined with the phosphor in accordance with the invention. For example, the diode array may be covered by a glass plate which is printed with phosphor triads which each have a red-luminescent, green-luminescent and blue-luminescent dot. The red-luminescent dot comprises [Eu(diketonate)$_a$X$_{b1}$X'$_{b2}$] as the phosphor.

The UV-diode is, in particular, an UV-diode of InGaN or GaN and has its emission maximum in the range between 370 and 410 mn with a half-width value FWHM<50 nm.

The phosphors in accordance with the invention have the following general formula: [Eu(diketonate)$_a$X'$_{b1}$X'$_{b2}$], wherein X is pyridine or a unidentate pyridine derivative and X' is 2,2'-bipyridine or a 2,2'-bipyridyl derivative and $2a+b_1+2b_2=8$. These complex co-ordination compounds of europium(III) comprise $Eu^{3+}$ as the metal center, anions of a diketonate (diketonate) as the charged ligands and pyridine or a pyridine derivative or 2,2-bipyridine or a 2,2'-bipyridyl derivative as the neutral ligands. The 2,2'-bipyridyl derivatives also include 1,10-phenanthroline and the derivatives thereof. These co-ordination compounds exhibit strong, optical intraligand transitions and, apart from the absorption of the chelate ligands, are also capable of effectively acting as light-sector antennae. The primary excitation by UV-radiation leads to a ligand-centered excited state whose energy will be transferred in a subsequent step to the europium ion where it leads to light emission. In these compounds, the original absorption properties of the ligands are substantially preserved and the interligand interactions are weak. The co-ordinative saturation of the europium precludes the tendency towards polymerization of the compounds which, as a result, are present in a mononuclear state. Consequently, unlike the phosphors in accordance with the state of the art, which are composed of host lattices doped with activator ions, here molecular phosphors are used.

To prepare the phosphors in accordance with the invention use is made of co-ordination compounds of europium with charged, anionic chelate ligands (diketonate) of the general formula [Eu(diketonate)$_3$], which are generally saturated in a co-ordinative manner by two or three further aqua ligands with the co-ordination number 8 or 9. A simple ligand substitution under mild conditions enables the introduction of a large number of uncharged organic ligands X, X' to form the product [Eu(diketonate)$_3$X,X'].

The above-described phosphors [Eu(diketonate)$_3$X,X'] can be prepared in accordance with the following general reaction scheme:

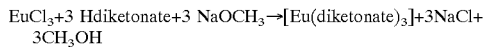

EuCl$_3$+3 Hdiketonate+3 NaOCH$_3$→[Eu(diketonate)$_3$]+3NaCl+ 3CH$_3$OH

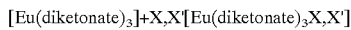

[Eu(diketonate)$_3$]+X,X'[Eu(diketonate)$_3$X,X']

(diketonate) may for example be an anion of the diketonates acac, thd, ttfa, fod, tfnb, dpm (see formula scheme), which are bidentate ligands. X may for example be pyridine or a pyridine derivative or bipyridine or a bipyridine derivative. Bipyridine derivatives also are, in particular, compounds which are derived from 1,10-phenonthroline, such as dpphen, mphen, dmphen, tmphen, NOphen, Clphen, dppz (see formula scheme). The monodentate or bidentate ligands are selected so that the europium ion is co-ordinated eight times in all.

The reaction products are obtained as a microcrystalline precipitate. To purify the materials, they are recrystallized from ethanol.

EXAMPLE 1

Synthesis of [Eu(ttfa)$_3$(Clphen)]

A quantity of 2.977 g (13.4 mmol) ttfa are dissolved in 100 ml ethanol. A quantity of 44.6 ml (4.46 mmol) 0.1 m EuCl$_3$ solution is added to this solution. Subsequently, 0.724 g (13.4. mmol) NaOCH$_3$ is also added. The slightly turbid solution is stirred for two hours at 60° C. Subsequently, the solution is filtered in order to remove the NaCl formed. Distilled water is added drop-wise to the clear filtrate in order to precipitate the product. The suspension is allowed to stand for several hours and the bright-yellow substance is sucked off. The intermediate product of the general formula [Eu(ttfa)$_3$(H$_2$O)$_3$] is washed with water a number of times and dried at 50° C.

A quantity of 1 g (1.22 mmol) [Eu(ttfa)$_3$(H$_2$O)$_3$] is suspended in 80 ml ethanol. A quantity of 0.438 g (2.21 mmol) 5-chloro-1,10-phenanthroline is added thereto. The suspension is refluxed for two hours and, after cooling, the product is sucked off at room temperature. The substance is washed a number of times with a small quantity of ice-cold ethanol. The microcrystalline product is dried at 50° C. and, to purify it, recrystallized from ethanol.

Photophysical characterization of the powder of [Eu(ttfa)$_3$ (Clphen)]

| Abs$_{254}$ [%] | QE$_{254}$[%] | EX at [nm] | EM at [nm] | τ [ms]* | LE [lm/W] | colour point |
|---|---|---|---|---|---|---|
| 93 | 75 | 333,383 | 613,618, 704 | 0.79 | 261 | x = 0.652 y = 0.330 |

*mono-exponential gradient

EXAMPLE 2

Synthesis of [Eu(ttfa)$_3$(phen)]

A quantity of 2.977 g (13.4 mmol) ttfa are dissolved in 100 ml ethanol. A quantity of 44.6 ml (4.46 mmol) 0.1 m EuCl$_3$ solution is added to this solution. Subsequently, 0.724 g (13.4 mmol) NaOCH$_3$ is also added. The slightly turbid solution is stirred for two hours at 60° C. Subsequently, the solution is filtered in order to remove the NaCl formed. Distilled water is added drop-wise to the clear filtrate in order to precipitate the product. The suspension is allowed to stand for several hours and the bright-yellow substance is sucked off. The intermediate product of the general formula [Eu(ttfa)$_3$(H$_2$O)$_3$] is washed with water a number of times and dried at 50° C.

A quantity of 1.809 g (2.21 mmol) [Eu(ttfa)$_3$(H$_2$O)$_3$] is suspended in 80 ml ethanol. A quantity of 0.438 g (2.21 mmol) 1,10-phenanthroline is added thereto. The suspension is refluxed for two hours and, after cooling, the product is sucked off at room temperature. The substance is washed a number of times with a small quantity of ice-cold ethanol. The microcrystalline product is dried at 50° C. and, to purify it, recrystallized from ethanol.

Photophysical characterization of the powder of [Eu(ttfa)$_3$ (Clphen)]

| Abs$_{254}$ [%] | QE$_{254[[%]}$ | EX at [nm] | EM at [nm] | τ [ms]* | LE [lm/W] | colour point |
|---|---|---|---|---|---|---|
| 97 | 72 | 261,387 | 613,619, 705 | 0.77 | 260 | x = 0.652 y = 0.329 |

*mono-exponential gradient

EXAMPLE 3

Synthesis of [Eu(tfnb)$_3$(dpphen)]

A quantity of 3 g (11.27 mmol) tfnb are dissolved in 100 ml ethanol. A quantity of 37.5 ml (3.75 mmol) 0.1 M EuCl$_3$ solution is added to the solution. Subsequently, also 0.609 g (11.27 mmol) NaOCH$_3$ is added. As a result, a white precipitate is formed. Stirring is continued for another hour, whereafter the product is sucked off. The substance is washed a number of times with distilled water and subsequently with a small quantity of ice-cold ethanol. The microcrystalline intermediate product of the general formula [Eu(tfnb)$_3$(H$_2$O)$_2$] is dried at 50° C.

A quantity of 0.6 g (0.61 mmol) [Eu(tfnb)$_3$(H$_2$O)$_2$] is suspended in 80 ml ethanol. A quantity of 0.202 g (0.61 mmol) 4,7-diphenyl-1,10-phenanthroline is added thereto. During heating to 60° C., a clear solution is formed. This solution is refluxed for two hours. During cooling of said solution, a white substance precipitates, which is sucked off and washed with a small quantity of ice-cold ethanol. To purify the product, it is recrystallized from ethanol.

Photophysical characterization of the powder of [eu(tfnb)$_3$(dpphen)]

| Abs$_{254}$ [%] | QE$_{254}$[%] | EX at [nm] | EM at [nm] | τ [ms]* | LE [lm/W] | colour point |
|---|---|---|---|---|---|---|
| 97 | 64 | 268,333, 400 | 614,618, 705 | 0.61 | 255 | x = 0.657 y = 0.326 |

*mono-exponential gradient

| Formula scheme |  |
|---|---|
| Anionichelate ligands (diketonate) | |
| acac | pentane-2,4-dionate |
| thd | 2,2,6,6-tetramethyl-3,5-hepandionate |
| ttfa | 1-(2-thenoyl)-4-4-4-trifluoro-1,3-1,3-butanedionate |

| -continued | |
|---|---|
| Formula scheme | |
| fod | 7,7-dimethyl-1,1,1,2,2,3,3-heptafluoro-4,6,octanedionate |
| tfnb | 4,4,4-trifluoro-1-(2-naphtyl)1,3-butanedionate |
| dbm | 1,3-diphenyl-1,3-propanedionate |
| neutral chelate ligands (X) | |
| bpy | 2,2'-bipyridine |
| phn | 1,10-phenanthroline |
| dpphen | 4,7-diphenyl-1,10-phenanthroline |
| mphen | 5-methyl-1,10-phenanthroline |
| dmphen | 4,7-dimethyl-1,l0-phenanthroline |
| tmphen | 3,4,7,8-tetramethyl-1,10-phenanthroline |
| NOphen | 5-nitro-1,l0-phenanthroline |
| Clphen | 5-chloro-1,l0-phenanthroline |
| dppz | dipyridinephenazine |

We claim:

1. A diode-addressed color display comprising an UV-diode and a phosphor of the general formula [Eu(diketonate)$_a$X$_{b1}$X'$_{b2}$], wherein X=pyridine or a unidentate pyridine derivative and X' is 2,2'-bipyridine or a 2,2'-bipyridyl derivative and $2a+b_1+2b_2=8$.

2. A diode-addressed color display as claimed in claim 1, characterized in that a=3.

3. A diode-addressed color display as claimed in claim 1, characterized in that a=2.

4. A diode-addressed color display as claimed in claim 1, characterized in that it comprises a transparent polymeric coating which includes the phosphor of the general formula [Eu(diketonate)$_a$X$_{b1}$X'$_{b2}$] in solid solution.

* * * * *